(12) United States Patent
Bian et al.

(10) Patent No.: US 11,567,260 B1
(45) Date of Patent: Jan. 31, 2023

(54) PHOTONICS CHIPS WITH AMBIENT LIGHT SHADOWING OF OPTICAL COMPONENTS

(71) Applicant: GLOBALFOUNDRIES U.S. Inc., Malta, NY (US)

(72) Inventors: Yusheng Bian, Ballston Lake, NY (US); Won Suk Lee, Malta, NY (US); Lin Jiang, Clifton Park, NY (US); Colleen Meagher, Beacon, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/501,508

(22) Filed: Oct. 14, 2021

(51) Int. Cl.
G02B 6/122 (2006.01)
G02B 6/36 (2006.01)
H01L 31/0232 (2014.01)

(52) U.S. Cl.
CPC ......... *G02B 6/1225* (2013.01); *G02B 6/3636* (2013.01); *H01L 31/02327* (2013.01)

(58) Field of Classification Search
CPC ................ G02B 6/1225; G02B 6/3636; H01L 31/02327
See application file for complete search history.

(56) References Cited

U.S. PATENT DOCUMENTS 11,067,751 B2 7/2021 Meagher et al.
11,378,743 B1 * 7/2022 Bian .................... G02B 6/1225

OTHER PUBLICATIONS

Neutens et al., "Mitigation of UV-Induced Propagation Loss in PECVD Silicon Nitride Photonic Waveguides" ACS Photonics 2018, 5, 6, 2145-2150, Publication Date: Mar. 13, 2018.
Wilmart, et al., "A Versatile Silicon-Silicon Nitride Photonics Platform for Enhanced Functionalities and Applications" Applied Sciences 9, No. 2: 255.
K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019.
M. Rakowski, et al., "45nm CMOS—Silicon Photonics Monolithic Technology (45CLO) for next-generation, low power and high speed optical interconnects," in Optical Fiber Communication Conference (OFC) 2020, OSA Technical Digest (Optical Society of America, 2020), paper T3H.3.
Y. Bian, et al., "Towards low-loss monolithic silicon and nitride photonic building blocks in state-of-the-art 300mm CMOS foundry," in Frontiers in Optics / Laser Science, B. Lee, C. Mazzali, K. Corwin, and R. Jason Jones, eds., OSA Technical Digest (Optical Society of America, 2020), paper FW5D.2.
Y. Bian et al., "Monolithically integrated silicon nitride platform," 2021 Optical Fiber Communications Conference and Exhibition (OFC), 2021, pp. 1-3.

* cited by examiner

*Primary Examiner* — John Bedtelyon
(74) *Attorney, Agent, or Firm* — Thompson Hine LLP; Anthony Canale (57) ABSTRACT

Structures including an optical component and methods of forming a structure including an optical component. The structure includes an optical component on a substrate, and a back-end-of-line stack including multiple metal levels. Each of the metal levels includes a dielectric layer and metal features positioned over the optical component as metal fill in the dielectric layer. The metal features in at least two of the metal levels are arranged to overlap such that the optical component is fully covered normal to the substrate.

20 Claims, 11 Drawing Sheets

PHOTONICS CHIPS WITH AMBIENT LIGHT SHADOWING OF OPTICAL COMPONENTS

BACKGROUND

The present invention relates to photonics chips and, more specifically, to structures including an optical component and methods of forming a structure including an optical component.

Photonics chips are used in many applications and systems including, but not limited to, data communication systems and data computation systems. A photonics chip integrates on-chip optical components, such as waveguides, photodetectors, modulators, and optical power splitters, and on-chip electronic components, such as field-effect transistors, into a unified platform. Among other factors, layout area, cost, and operational overhead may be reduced by the integration of both types of components on the same chip.

A photonics chip may include a multilayer stack formed by back-end-of-line processing over the optical components and electronic components. The multilayer stack has interlayer dielectric layers that are arranged in different levels, and metal lines that are placed in the interlayer dielectric layers. The interlayer dielectric layers provide electrical isolation, and the metal lines may be vertically interconnected by vias.

After fabrication, a photonics chip may be exposed to ambient light, such as white light. The back-end-of-line stack does not prevent the ambient light from reaching the optical components. Optical components constructed from a dielectric material, such as silicon nitride, may exhibit a sensitivity to ambient light exposure. More specifically, light-induced degradation of the dielectric material due to ambient light exposure may adversely affect performance. For example, the propagation loss in a silicon nitride waveguide may be enhanced by degradation due to a history of prior ambient light exposure.

Improved structures including an optical component and methods of forming a structure including an optical component are needed.

SUMMARY

In an embodiment of the invention, a structure for a photonics chip is provided. The structure includes an optical component on a substrate, and a back-end-of-line stack including a plurality of metal levels. Each of the plurality of metal levels includes a dielectric layer and a plurality of metal features positioned over the optical component as metal fill in the dielectric layer. The plurality of metal features in at least two of the plurality of metal levels are arranged to overlap such that the optical component is fully covered normal to the substrate.

In an embodiment of the invention, a method of forming a structure for a photonics chip is provided. The method includes forming an optical component on a substrate, and forming a back-end-of-line stack including a plurality of metal levels. Each of the plurality of metal levels includes a dielectric layer and a plurality of metal features positioned over the optical component as metal fill in the dielectric layer. The plurality of metal features in at least two of the plurality of metal levels are arranged to overlap such that the optical component is fully covered normal to the substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
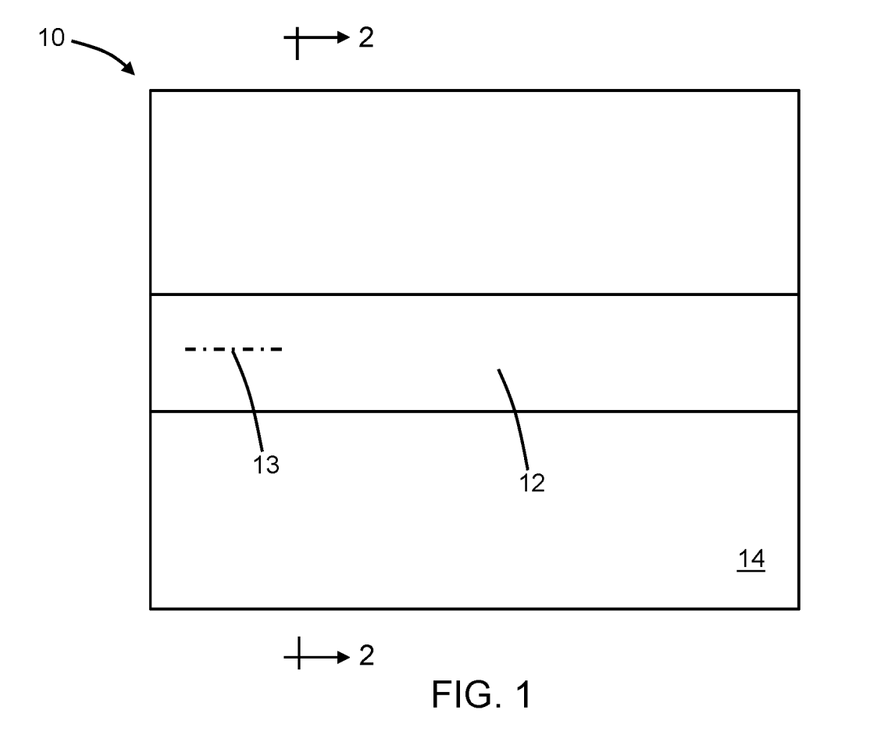
FIG. 1 is a plan view of a structure at an initial fabrication stage of a processing method in accordance with embodiments of the invention.
Figure 2:
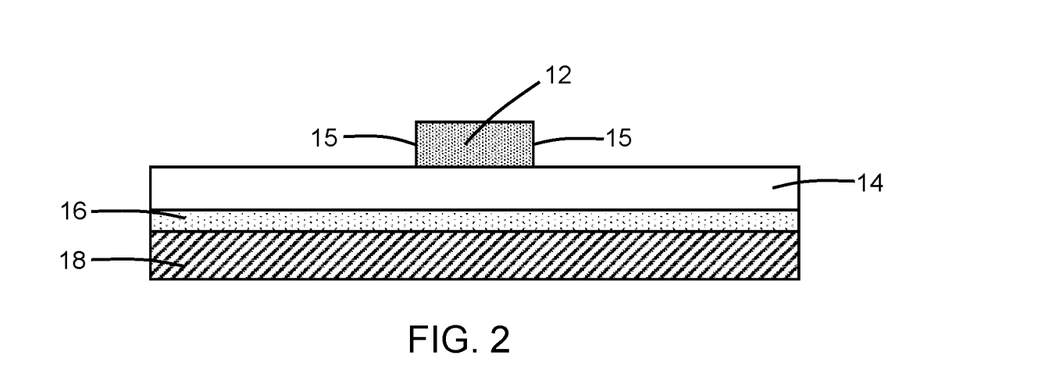
FIG. 2 is a cross-sectional view of the structure taken generally along line 2-2 in FIG. 1.

With reference to FIGS. 1, 2 and in accordance with embodiments of the invention, a structure 10 includes an optical component in the representative form of a waveguide core 12, and may have a longitudinal axis 13 and side surfaces 15. The waveguide core 12 may be comprised of a dielectric material, such as silicon nitride, that is sensitive to ambient light exposure. The waveguide core 12 may be formed by depositing a layer of the dielectric material and then patterning the deposited layer with lithography and etching processes. The waveguide core 12 may be positioned on a dielectric layer 14. In an embodiment, the dielectric layer 14 may be comprised of silicon dioxide. The dielectric layer 14 may be positioned on a dielectric layer 16, which may be a buried oxide layer of a silicon-on-insulator substrate, and the silicon-on-insulator substrate may further include a substrate 18 comprised of a semiconductor material (e.g., single-crystal silicon) beneath the buried oxide layer.

In an alternative embodiment, the waveguide core 12 may be replaced by a different type of optical component, such as a closed ring characteristic of a filter or a wavelength-dependent modulator, a directional coupler, or a multiple-mode interference coupler. In an alternative embodiment, the waveguide core 12 may include a bend (e.g., a 90° bend or a 180° bend) that defines a change of direction for routing on the photonics chip.

Figure 3:
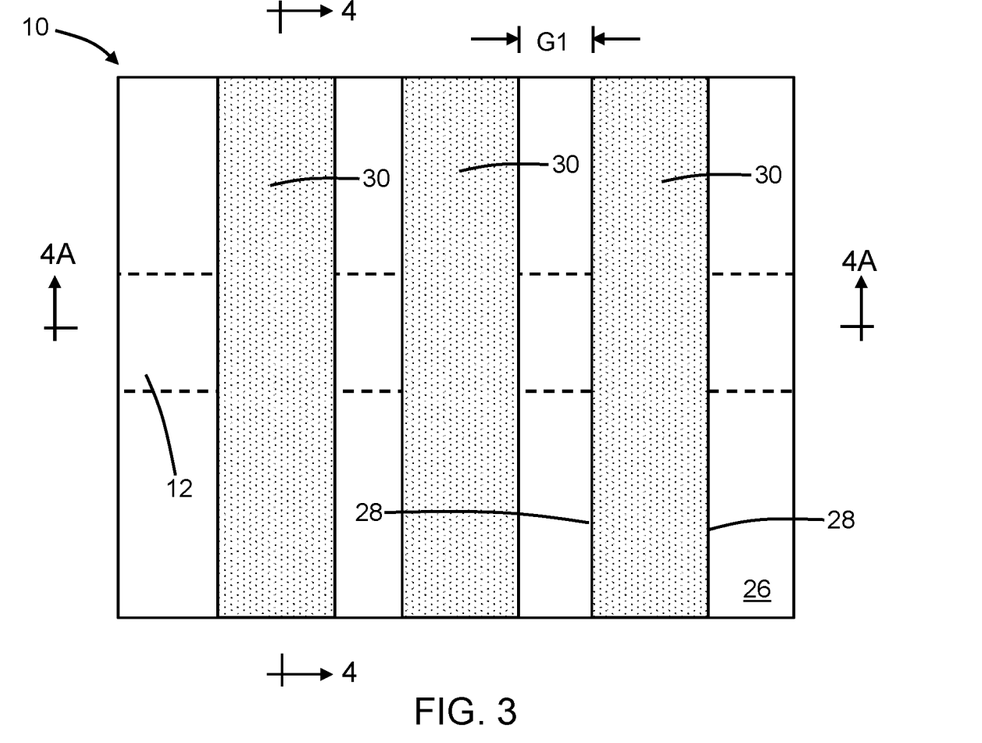
FIG. 3 is a plan view of the structure at a fabrication stage subsequent to FIG. 1.
Figure 4:
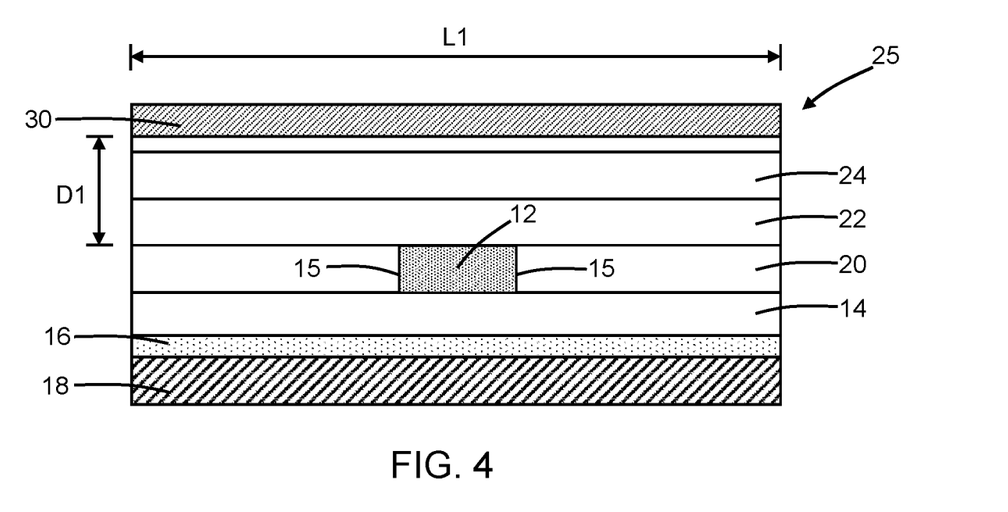
FIG. 4 is a cross-sectional view of the structure taken generally along line 4-4 in FIG. 3.
Figure 4A:
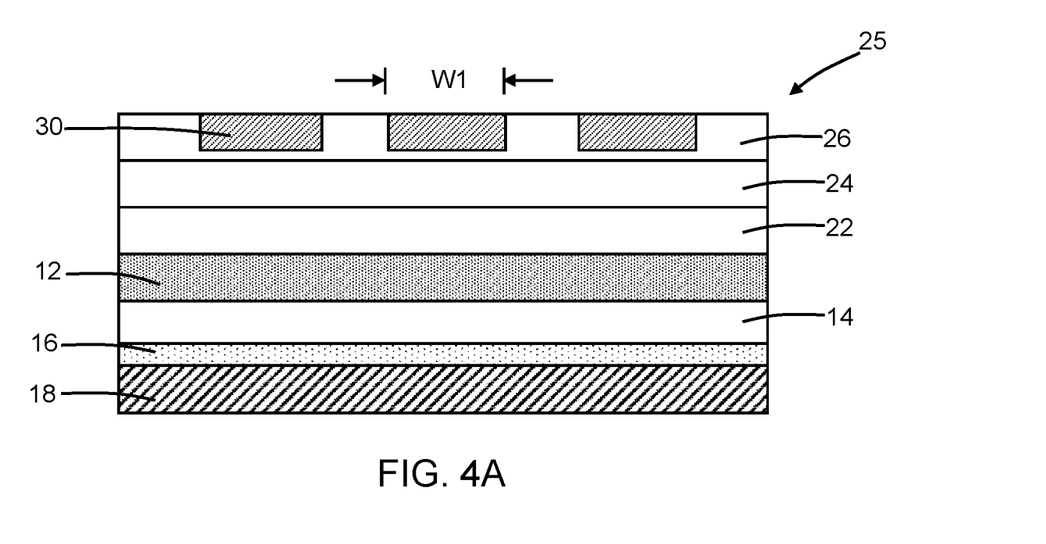
FIG. 4A is a cross-sectional view of the structure taken generally along line 4A-4A in FIG. 3.

With reference to FIGS. 3, 4, 4A in which like reference numerals refer to like features in FIGS. 1, 2 and at a subsequent fabrication stage, dielectric layers 20, 22, 24, 26 of a back-end-of-line stack 25 may be formed over the waveguide core 12 and dielectric layer 14. The dielectric layers 20, 22, 24, 26 are comprised of an inorganic dielectric material, such as silicon dioxide, that may be deposited by, for example, chemical vapor deposition. The refractive indices of the dielectric layers 20, 22, 24, 26 may be less than the refractive index of the waveguide core 12. The waveguide core 12 may be embedded in the dielectric layer 20, which may be deposited and planarized by chemical-mechanical polishing to eliminate topography.

The dielectric layers 22, 24, 26 may provide interlayer dielectrics for multiple metal levels of the back-end-of-line stack 25. For example, the dielectric layer 22 may participate in forming a lower metal level, the dielectric layer 24 may participate in forming a lower metal level, and the dielectric layer 26 may participate in forming an upper metal level. The metal features 30 are positioned as dummy fill in the dielectric layer 26. The dielectric layers 22, 24 lack metal features in order to not impact the performance of the waveguide core 12. In alternative embodiments, additional metal levels that include dielectric layers without metal features may be added between the dielectric layer 22 and the dielectric layer 24 such that more than two lower metal levels (i.e., those metal levels closest to waveguide core 12) are positioned in a vertical direction between the waveguide core 12 and the lowermost upper metal level containing the metal features 30.

The metal features 30 are spaced vertically from the waveguide core 12 by a threshold distance D1 sufficient to ensure that the impact of the metal features 30 on the light propagation performance of the waveguide core 12 is either minimal or negligible. The dielectric layers 22, 24 are positioned in a vertical direction between the waveguide core 12 and the dielectric layer 26, and their individual layer thicknesses provide contributions to the threshold distance D1. In an embodiment, the threshold distance D1 may range from about one (1) micron to about two (2) microns.

The metal features 30 are arranged in a non-staggered pattern, such as an arrangement in a row of a one-dimensional array. Each metal feature 30 includes side edges 28 that may be oriented transverse to the longitudinal axis 13 of the waveguide core 12. Adjacent pairs of the metal features 30 are separated by gaps G1 that are filled by the dielectric material of the dielectric layer 26. Each metal feature 30 has a length L1 and a width W1 defining an area normal to the substrate 18 (i.e., in plan view or in a vertical direction relative to the substrate 18), and the gap G1 is defined by a side-to-side spacing between the facing side edges 28 of adjacent metal features 30. In an alternative embodiment, the metal features 30 may be arranged in multiple rows to define a two-dimensional array.

As used herein, "a staggered pattern" refers to a set of metal features that are adjacent to one another in one direction of an x-y plane but not in another direction of the x-y plane due to a positional shift that provides misalignment. For example, a staggered pattern may have metal features directly adjacent to each other in an x-direction in an x-y plane (e.g., rows of an array), but not directly adjacent to each other in the y-direction (e.g., columns of an array) in the x-y plane. As used herein, "a non-staggered pattern" refers to a set of metal features that lack a positional shift in either the x-direction or the y-direction in the x-y plane. As used herein, the term "side edge" refers to an area or strip immediately inside an outer boundary of a metal feature as a margin defining a portion of the metal feature.

The metal level including the dielectric layer 26 and the metal features 30 may be formed by a damascene process using deposition, polishing, lithography, and etching techniques. Specifically, the dielectric layer 26 may be deposited and patterned using lithography and etching processes to define trenches that are filled by a planarized metal (e.g., copper or aluminum) to define the metal features 30. In an embodiment, the metal features 30 may have a rectangular or square shape normal to the substrate 18. In an alternative embodiment, the metal features 30 may have a non-rectangular shape normal to the substrate 18.

Figure 5:
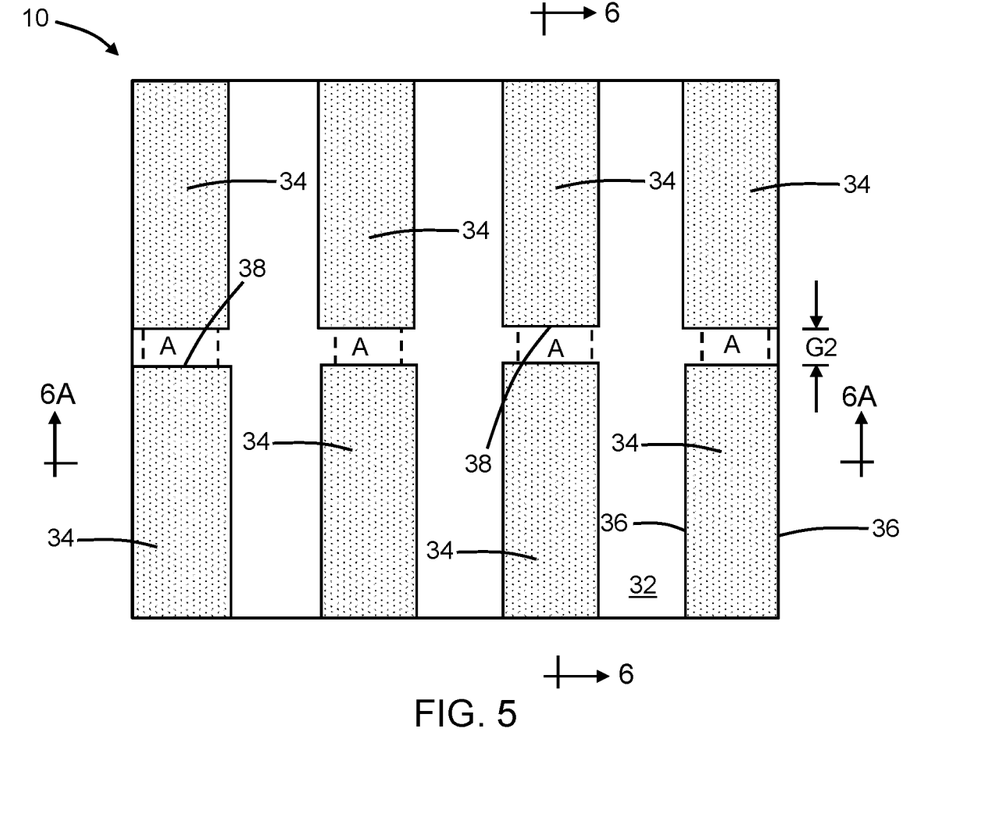
FIG. 5 is a plan view of the structure at a fabrication stage subsequent to FIG. 3.
Figure 6:
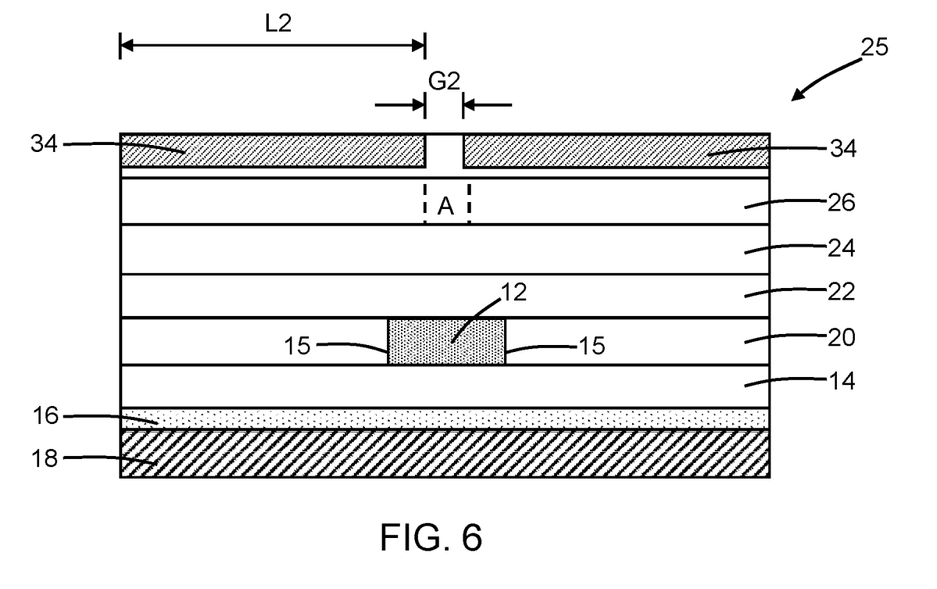
FIG. 6 is a cross-sectional view of the structure taken generally along line 6-6 in FIG. 5.
Figure 6A:
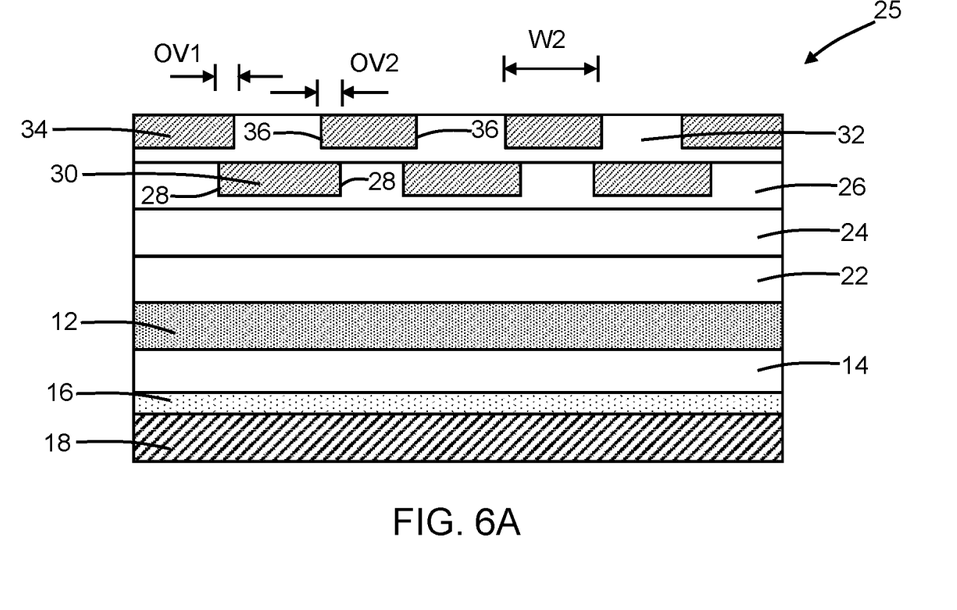
FIG. 6A is a cross-sectional view of the structure taken generally along line 6A-6A in FIG. 5.

With reference to FIGS. 5, 6, 6A in which like reference numerals refer to like features in FIGS. 3, 4, 4A and at a subsequent fabrication stage, an upper metal level includes a dielectric layer 32 that is formed over the metal features 30 and dielectric layer 26 of the underlying metal level. The dielectric layer 32 is comprised of an inorganic dielectric material, such as silicon dioxide, that may be deposited by, for example, chemical vapor deposition Metal features 34 are placed as dummy fill in the dielectric layer 32. In an embodiment, the metal features 34 are disconnected from the metal features 30, and the metal features 34 are separated from the metal features 30 by the dielectric material of the dielectric layer 32. Each metal feature 34 includes side edges 36 that are oriented transverse to the longitudinal axis 13 of the waveguide core 12 and side edges 38 that are oriented parallel to the longitudinal axis 13 of the waveguide core 12. The side edges 36 of the metal features 34 may be aligned parallel to the side edges 28 of the metal features 30.

The metal level including the dielectric layer 32 and the metal features 34 may be formed by a damascene process using deposition, polishing, lithography, and etching techniques. Specifically, the dielectric layer 32 may be deposited and patterned using lithography and etching processes to define trenches that are filled by a planarized metal (e.g., copper or aluminum) to define the metal features 34. In an embodiment, the metal features 34 may have a rectangular or square shape normal to the substrate 18. In an alternative embodiment, the metal features 34 may have a non-rectangular shape normal to the substrate 18. The metal features 34 may have the same thickness as the metal features 30 or a different thickness than the metal features 30, and the metal features 34 may contain the same metal as the metal features 30 or a different metal than the metal features 30.

The metal features 34 are arranged in a non-staggered pattern, such as an arrangement in the rows and columns of a two-dimensional array. The metal features 34 have a different arrangement, in a normal direction, than the underlying metal features 30 such that the metal features 34 are laterally offset relative to the metal features 30, and the metal features 34 are overlaid or superimposed on the metal features 30. At least one of the side edges 36 of the metal features 34 overlaps with at least one of the side edges 28 of the metal features 30. In that regard, the side edges 36 of metal features 34 may overlap with the side edges 28 of adjacent pairs of the metal features 30 in the underlying metal level such that each gap G1 is partially covered. The width dimension W2 of each metal feature 34 is greater than the lateral dimension of the underlying gap G1 such that the side edges 28 and 36 overlap by distances OV1 and OV2. In an embodiment, each metal feature 34 may be centered over one of the gaps G1 such that the distance OV1 is equal to distance OV2.

Each metal feature 34 has a length L2 and a width W2 defining an area normal to the substrate 18. The area of the metal features 34 may be less than the area of the metal features 30 such that the metal features 30 and the metal features 34 have different sizes. As a result, the side edges 38 of adjacent metal features 34 in the columns of the array are separated by a gap G2 that is filled by the dielectric material of the dielectric layer 32. Within the gap G2, areas A overlap with the dielectric material of the dielectric layer 26 in the underlying metal level, and areas located between the areas A overlap with the metal features 30 in the underlying metal level. In the areas A, open light paths unblocked by metal features 30 and metal features 34 exist that extend through the full thickness (i.e., all intervening metal levels) of the back-end-of-line stack 25 to the waveguide core 12.

Figure 7:
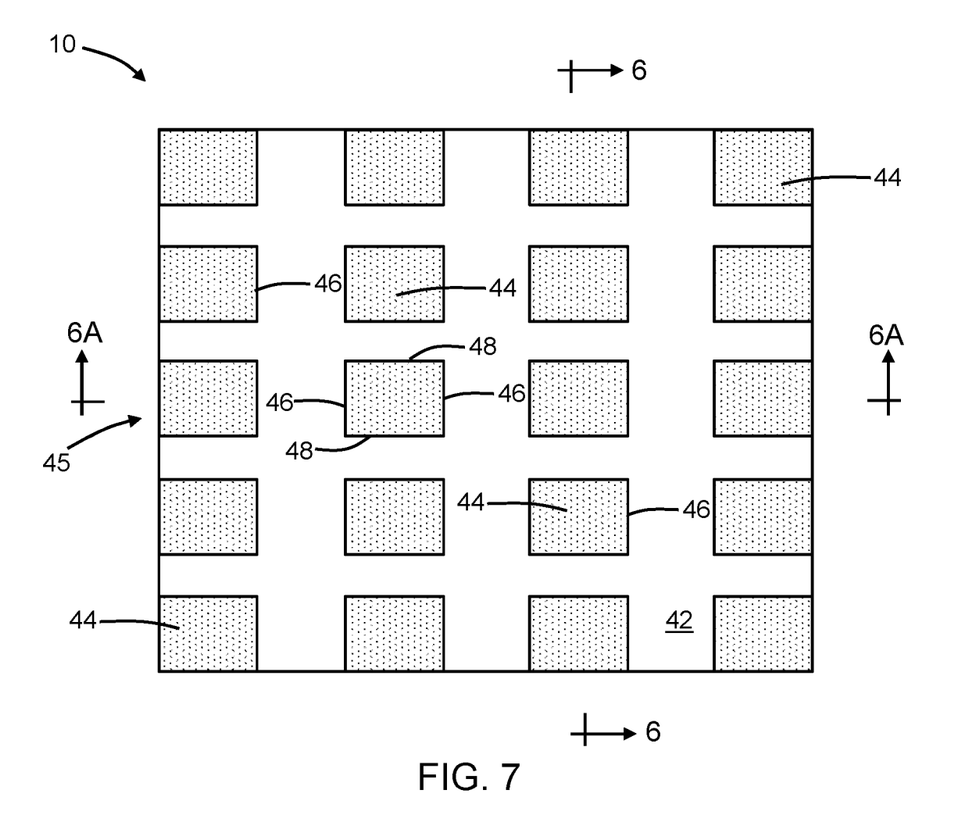
FIG. 7 is a plan view of the structure at a fabrication stage subsequent to FIG. 5.
Figure 8:
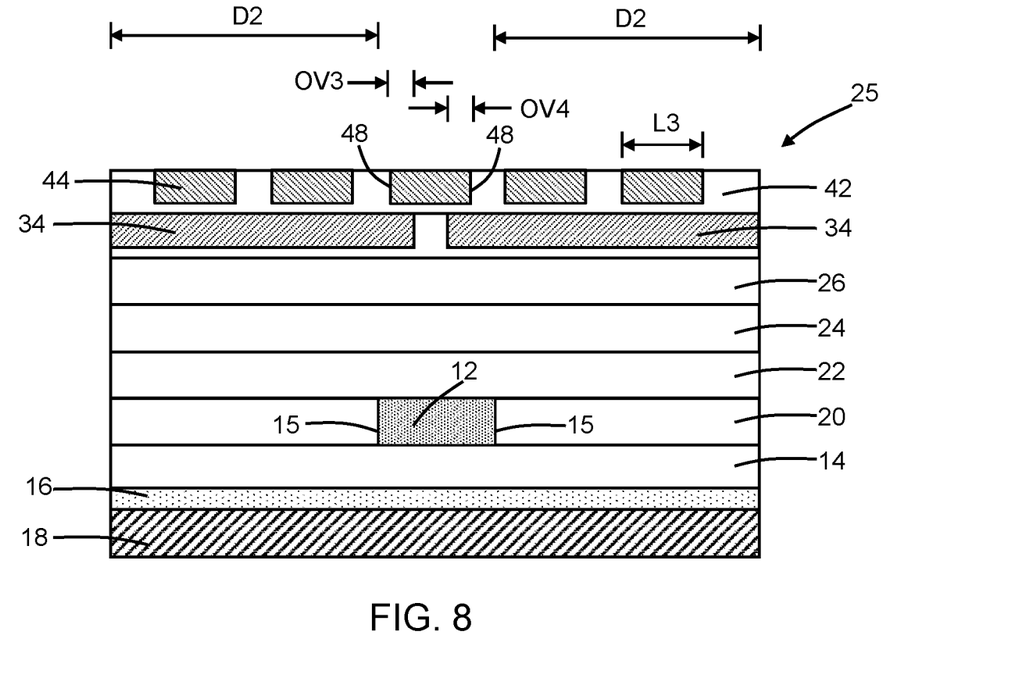
FIG. 8 is a cross-sectional view of the structure taken generally along line 8-8 in FIG. 7.
Figure 8A:
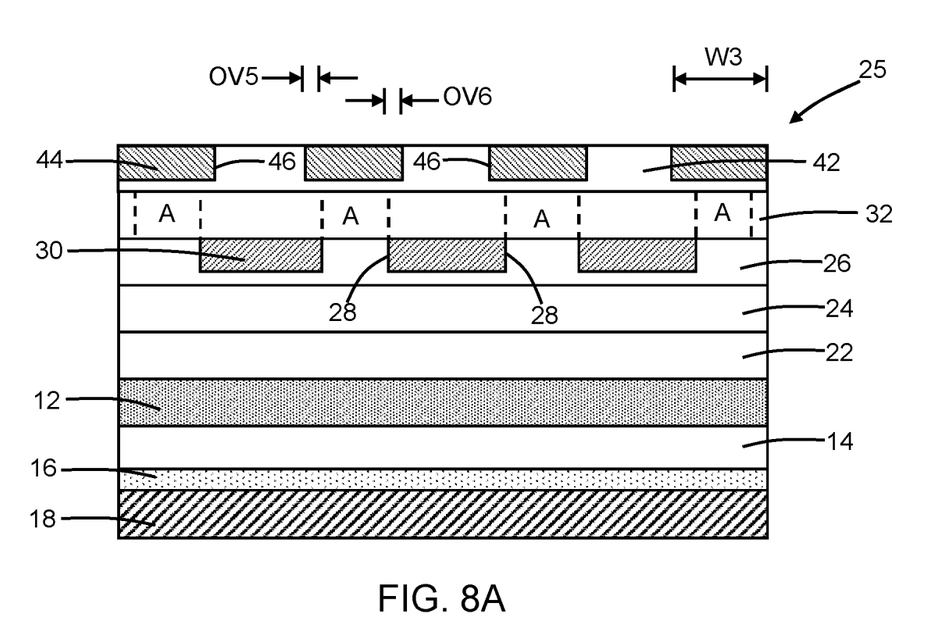
FIG. 8A is a cross-sectional view of the structure taken generally along line 8A-8A in FIG. 7.

With reference to FIGS. 7, 8, 8A in which like reference numerals refer to like features in FIGS. 5, 6, 6A and at a subsequent fabrication stage, an upper metal level includes a dielectric layer 42 that is formed over the metal features 34 and dielectric layer 32 of the underlying metal level. The dielectric layer 42 is comprised of an inorganic dielectric material, such as silicon dioxide, that may be deposited by, for example, chemical vapor deposition.

Metal features 44 are placed as dummy fill in the dielectric layer 42. In an embodiment, the metal features 44 are disconnected from the metal features 34, and the metal features 44 are separated from the metal features 34 by the dielectric material of the dielectric layer 42. Each metal feature 44 includes side edges 46 that are oriented transverse to the longitudinal axis 13 of the waveguide core 12 and side edges 48 that are oriented parallel to the longitudinal axis 13 of the waveguide core 12.

The metal level including the dielectric layer 42 and the metal features 44 may be formed by a damascene process using deposition, polishing, lithography, and etching techniques. Specifically, the dielectric layer 42 may be deposited and patterned using lithography and etching processes to define trenches that are filled by a planarized metal (e.g., copper or aluminum) to define the metal features 44. In an embodiment, the metal features 44 may have a rectangular or square shape normal to the substrate 18. In an alternative embodiment, the metal features 44 may have a non-rectangular shape normal to the substrate 18. The metal features 44 may have the same thickness as the metal features 34 or a different thickness than the metal features 34, and the metal features 44 may contain the same metal as the metal features 34 or a different metal than the metal features 34.

The metal features 44 are arranged in a non-staggered pattern, such as an arrangement in the rows and columns of a two-dimensional array. The metal features 44 have a different arrangement, in a normal direction, than the metal features 30 and a different arrangement, in a normal direction, than the metal features 34. Each metal feature 44 has a length L3 and a width W3 defining an area normal to the substrate 18. The area of the metal features 44 may be less than the area of the metal features 34 such that the metal features 44 and the metal features 34 have different sizes.

The metal features 44 are overlaid or superimposed on the metal features 34, as well as on the metal features 30. In particular, each metal feature 44 in a row 45 of the array is positioned in a vertical direction over one of the areas A (FIG. 5). The metal features 44 in the row 45 overlap with the metal features 34 in the adjacent underlying metal level and also overlap with the metal features 30 in the non-adjacent underlying metal level. At least one of the side edges 46, 48 of the metal features 44 in the row 45 overlaps with at least one of the side edges 36, 38 of the metal features 34. The side edges 48 in the row 45 overlap with the side edges 38 of each adjacent pair of the metal features 34 by distances OV3 and OV4. The side edges 46 overlap with the side edges 28 of each adjacent pair of the metal features 30 by distances OV5 and OV6. In an embodiment, each metal feature 34 in the row 45 may be centered over one of the areas A such that the distance OV3 is equal to distance OV4 and the distance OV5 is equal to distance OV6.

The metal features 30, the metal features 34, and the metal features 44 provide customized metal fills positioned such that, collectively, the metal features 30, 34, 44 fully cover, in a direction normal to the substrate 18, the underlying waveguide core 12. The metal features 30, 34, 44 have sufficient overlays to mitigate or prevent ambient light illumination capable of degrading the dielectric material contained in the waveguide core 12 and enhancing propagation loss in use, while simultaneously meeting ground rule requirements. Full coverage of the waveguide core 12 may be characterized by shadowing from ambient light illumination over a field of view defined by a threshold distance D2 relative to the opposite side surfaces 15 that laterally bound the footprint of the waveguide core 12, or other optical component. For example, the threshold distance D2 may range from 5 microns to 20 microns.

The metal fills provided by the metal features 30, the metal features 34, and the metal features 44 are formed in the upper levels of the back-end-of-line stack 25, and may be located in two or more of the upper levels of the back-end-of-line stack 25. Conventional metal fills placed in lower levels (e.g., the two lowermost metal levels) of a back-end-of-line stack are unable, either separately or in combination, to fully cover the waveguide core 12 due to, for example, ground rule (i.e., density) requirements.

In an alternative embodiment, the metal features 34 and the metal features 30 may have equal lengths such that the areas A between the side edges 38 of the metal features 34 are eliminated. Collectively, the metal features 30 and the metal features 34 may fully block the light path in a direction normal to the substrate 18 through the back-end-of-line stack 25 to the waveguide core 12 without the necessity of additional metal features in a different metal level.

Figure 9:
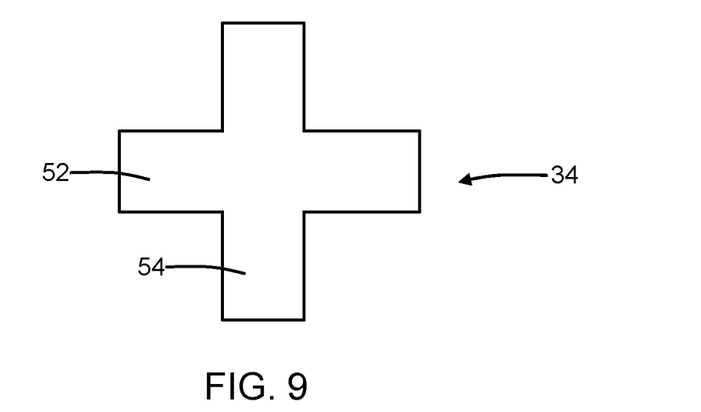
FIGS. 9 and 10 are plan views of a set of metal features arranged in different metal levels that may participate in forming a structure in accordance with alternative embodiments of the invention.
Figure 10:
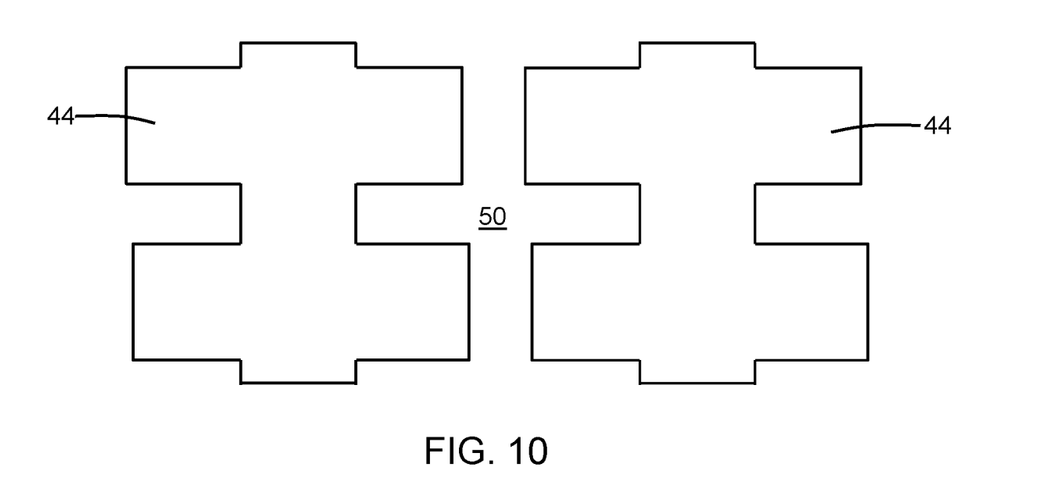

With reference to FIGS. 9, 10 and in accordance with alternative embodiments, the metal features 34 and the metal features 44 in different metal levels may have other geometrical shapes that provide customized metal fills. For example, the metal features 34 may have a cross shape (i.e., a geometrical shape including a pair of intersecting arms 52, 54 that are oriented transverse to each other), the metal features 44 may include multiple shapes with transversely-oriented arms, and adjacent metal features 44 may be arranged to define an open space 50. The open space 50 has arms arranged in a cross shape and is complementary in shape to the shape of the metal feature 34. The arms 52, 54 of the cross-shaped metal feature 34 may be slightly wider than the arms of the cross-shaped open space 50 to provide for overlapped edges. The metal features 34 and metal features 44 may fully cover, normal to the substrate 18, the underlying waveguide core 12.

Figures 11, 12:
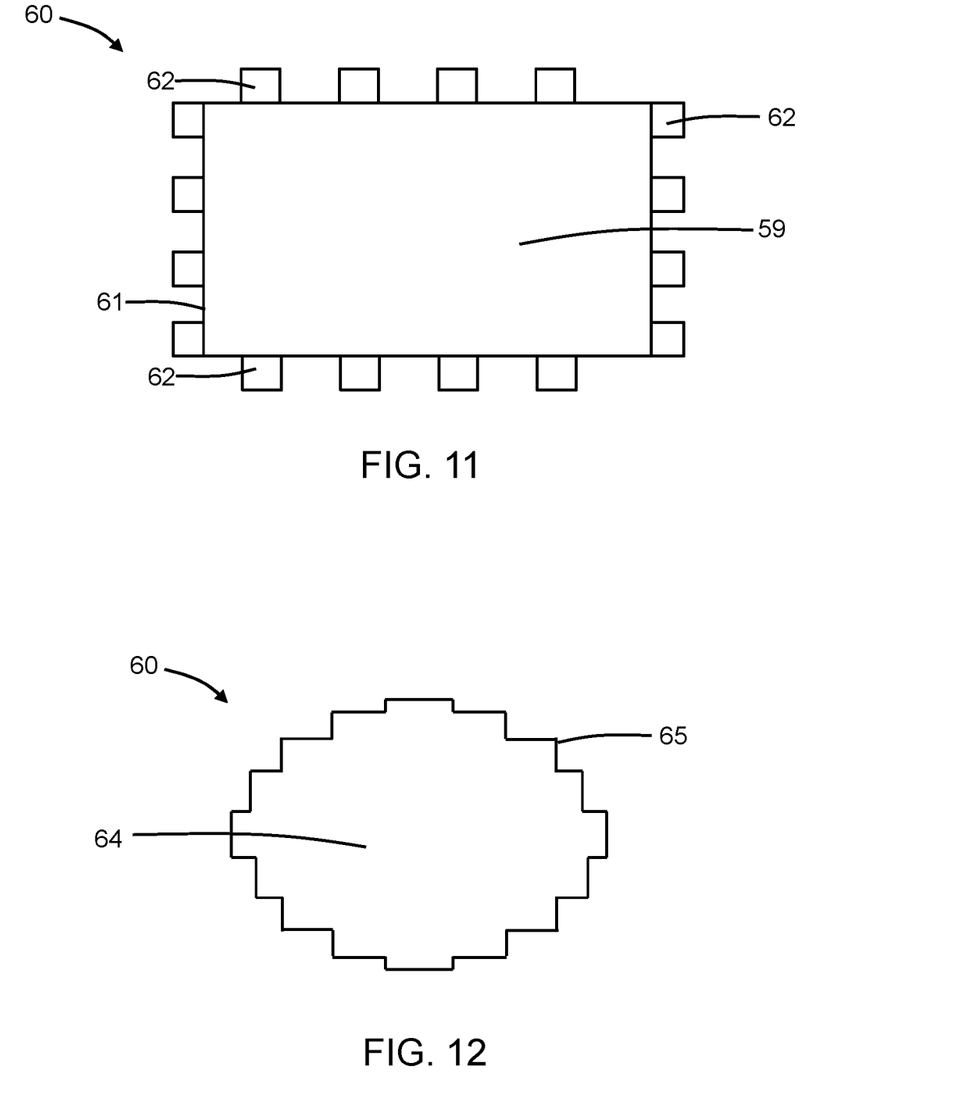
FIGS. 11 and 12 are plan views of metal features in accordance with alternative embodiments of the invention.

With reference to FIG. 11 and in accordance with alternative embodiments, the metal features 30, the metal features 34, and/or the metal features 44 may be shaped as a metal feature 60 that has a rectangular or square body 59 and features 62 that project outwardly from the side edges 61 of the rectangular or square body 59. The overlay of metal features 60 in a normal direction may be more tolerant of process margins due to the presence of the features 62.

With reference to FIG. 12 and in accordance with alternative embodiments, the metal feature 60 may include a body feature 64 that has irregular side edges 65, such as side edges 65 with a sawtooth shape that may enable omnidirectional shadowing. The body feature 64 may be generated by the superposition of multiple rectangular shapes.

Figure 13:
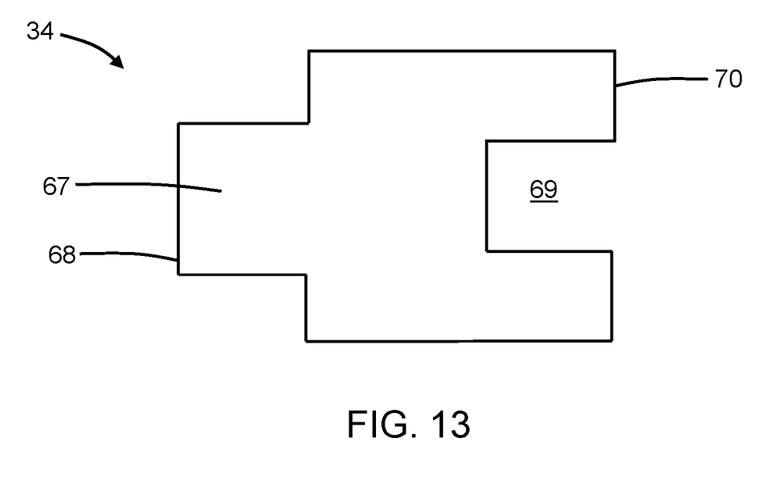
FIGS. 13 and 14 are plan views of a set of metal features arranged in different metal levels that may participate in forming a structure in accordance with alternative embodiments of the invention.
Figure 14:
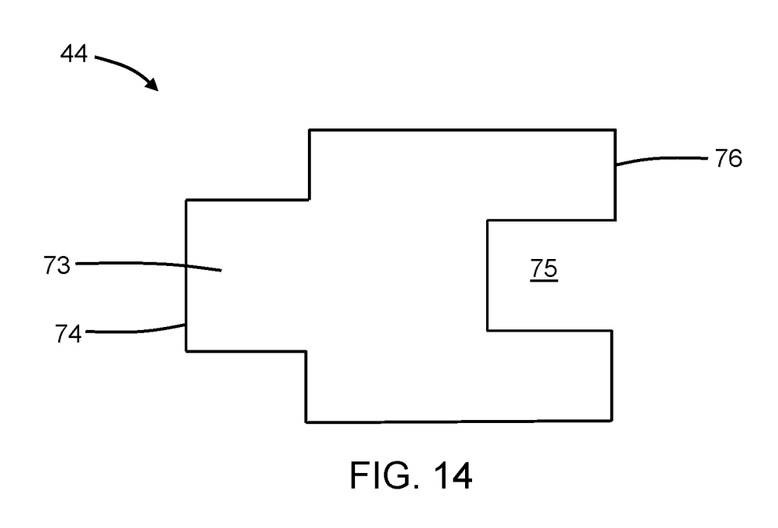

With reference to FIGS. 13, 14 and in accordance with alternative embodiments, each metal feature 34 may be shaped to include a tongue 67 at a side edge 68 and a groove 69 at a side edge 70, and each metal feature 44 may be shaped to include a tongue 73 at a side edge 74 and a groove 75 at an opposite side edge 76. The metal features 34 and the metal features 44, which are arranged in different metal levels, have overlapping side edges such that the underlying waveguide core 12 is fully covered in a direction normal to the substrate 18. To that end, the tongue 67 of the metal feature 34 may be wider than the groove 75 of the metal feature 44, the tongue 73 of the metal feature 44 may be wider than the groove 69 of the metal feature 34, and the metal features 34, 44 may be arranged such the side edge 74 overlaps with the side edge 70 and the side edge 68 overlaps with the side edge 76. The metal features 34, 44 create a daisy-chained row that can be replicated and placed with a side-to-side overlap, if needed, to provide full coverage of the waveguide core 12.

Figure 15:
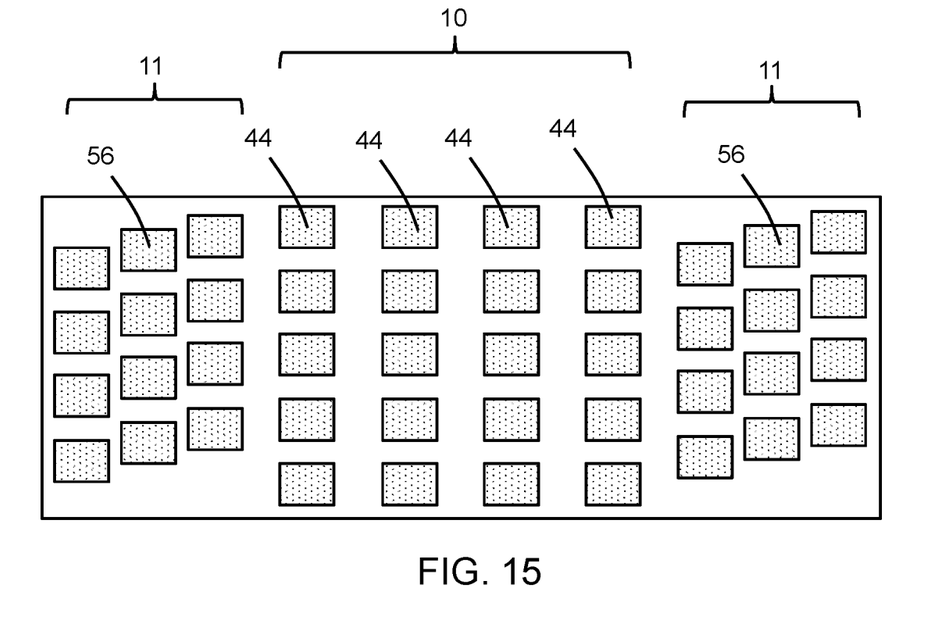
FIG. 15 is a plan view of a structure in accordance with alternative embodiments of the invention.

With reference to FIG. 15 and in accordance with alternative embodiments, a region of the photonics chip including the custom metal fill of the structure 10 may be surrounded by standard-density metal fills over other regions 11 on the photonics chip. The standard-density metal fills include metal features 56 positioned with a staggered arrangement, and may be located in the same metal level as the metal features 44. Spaces between the metal features 56 are filled by dielectric material, and the lower metal levels beneath the metal features 56 include dielectric layers that lack metal features such that the ambient light path is not fully blocked. The regions 11 may include optical components (e.g., silicon-based optical components) and/or electronic components (e.g., silicon-based field-effect transistors) that are not fully covered and are susceptible to ambient light exposure.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. As used herein, different features may overlap if a side edge of a feature extends over, and overlays a side edge of, the other feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a photonics chip, the structure comprising:
   a substrate;
   an optical component on the substrate; and
   a back-end-of-line stack including a plurality of metal levels, each of the plurality of metal levels including a dielectric layer and a plurality of metal features positioned over the optical component as metal fill in the dielectric layer, and the plurality of metal features in at least two of the plurality of metal levels arranged to overlap such that the optical component is fully covered normal to the substrate.

2. The structure of claim 1 wherein the optical component is a waveguide core.

3. The structure of claim 1 wherein the optical component comprises a dielectric material.

4. The structure of claim 3 wherein the plurality of metal features in each of the plurality of metal levels comprise a metal.

5. The structure of claim 1 wherein the optical component comprises silicon nitride.

6. The structure of claim 1 wherein the back-end-of-line stack includes a second plurality of metal levels positioned in a vertical direction between the plurality of metal levels and the optical component, and each of the second plurality of metal levels includes a dielectric layer and lacks metal fill in the dielectric layer over the optical component.

7. The structure of claim 1 wherein the plurality of metal levels includes a first metal level and a second metal level over the first metal level, the plurality of metal features in the first metal level include a first plurality of side edges, the plurality of metal features in the second metal level include a second plurality of side edges, and at least one of the first plurality of edges overlaps with at least one of the second plurality of side edges.

8. The structure of claim 1 wherein the optical component includes a side edge, and the plurality of metal features in the plurality of metal levels extend laterally from the side edge by a threshold distance.

9. The structure of claim 1 wherein the plurality of metal features in each of the plurality of metal levels has a square shape or a rectangular shape.

10. The structure of claim 1 wherein the plurality of metal features in each of the plurality of metal levels include a rectangular or square body with a plurality of side edges and a plurality of features that project outwardly from the plurality of side edges.

11. The structure of claim 1 wherein the plurality of metal features in each of the plurality of metal levels include a body having a tongue and a groove.

12. The structure of claim 1 wherein the plurality of metal features in each of the plurality of metal levels include a body having a plurality of saw-toothed side edges.

13. The structure of claim 1 wherein the plurality of metal levels includes a first metal level and a second metal level over the first metal level, and the plurality of metal features in the first metal level includes a pair of intersecting arms that are oriented transverse to each other in a cross shape.

14. The structure of claim 13 wherein the plurality of metal features in the second metal level are arranged to define openings having a cross shape, and each opening is overlapped by the pair of intersecting arms.

15. The structure of claim 1 wherein the plurality of metal levels includes a first metal level and a second metal level over the first metal level, and the plurality of metal features in the first metal level and the plurality of metal features in the second metal level have different areas normal to the substrate.

16. The structure of claim 1 wherein the plurality of metal features in each of the plurality of metal levels are arranged in a non-staggered pattern.

17. A method of forming a structure for a photonics chip, the method comprising:
    forming an optical component on a substrate; and
    forming a back-end-of-line stack including a plurality of metal levels, wherein each of the plurality of metal levels includes a dielectric layer and a plurality of metal features positioned over the optical component as metal fill in the dielectric layer, and the plurality of metal features in at least two of the plurality of metal levels are arranged to overlap such that the optical component is fully covered normal to the substrate.

18. The method of claim 17 wherein the optical component comprises silicon nitride, and the plurality of metal features in each of the plurality of metal levels comprise a metal.

19. The method of claim 17 wherein the back-end-of-line stack includes a second plurality of metal levels positioned in a vertical direction between the plurality of metal levels and the optical component, and each of the second plurality of metal levels includes a dielectric layer and lacks metal fill in the dielectric layer over the optical component.

20. The method of claim 17 wherein the plurality of metal levels includes a first metal level and a second metal level over the first metal level, the plurality of metal features in the first metal level include a first plurality of side edges, the plurality of metal features in the second metal level include a second plurality of side edges, and at least one of the first plurality of edges overlaps with at least one of the second plurality of side edges.

* * * * *